United States Patent
Min et al.

(10) Patent No.: US 11,978,923 B2
(45) Date of Patent: May 7, 2024

(54) BATTERY MODULE HAVING STRUCTURE IN WHICH ENERGY DENSITY IS IMPROVED, AND BATTERY PACK AND VEHICLE COMPRISING SAME

(71) Applicant: LG Chem, Ltd., Seoul (KR)

(72) Inventors: Dai-Ki Min, Daejeon (KR); Jung-Min Kwak, Daejeon (KR); Jong-Ha Jeong, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 59 days.

(21) Appl. No.: 17/042,579

(22) PCT Filed: Dec. 19, 2019

(86) PCT No.: PCT/KR2019/018140
§ 371 (c)(1),
(2) Date: Sep. 28, 2020

(87) PCT Pub. No.: WO2020/138847
PCT Pub. Date: Jul. 2, 2020

(65) Prior Publication Data
US 2021/0020891 A1    Jan. 21, 2021

(30) Foreign Application Priority Data

Dec. 26, 2018    (KR) .......................... 10-2018-0169967

(51) Int. Cl.
*H01M 50/502*    (2021.01)
*H01M 10/48*    (2006.01)
(Continued)

(52) U.S. Cl.
CPC ......... *H01M 50/502* (2021.01); *H01M 10/48* (2013.01); *H01M 10/482* (2013.01);
(Continued)

(58) Field of Classification Search
CPC ............. H01M 50/502; H01M 50/531; H01M 50/543; H01M 10/482; H01M 10/778; H01M 2220/20429; H01M 2220/20
(Continued)

(56) References Cited

U.S. PATENT DOCUMENTS

2012/0121940 A1\* 5/2012 Park ................... H01M 50/569
429/7
2013/0040170 A1\* 2/2013 Choi ................... H01M 50/55
29/623.2
(Continued)

FOREIGN PATENT DOCUMENTS

CN      107210404 A     9/2017
CN      206806468 U    12/2017
(Continued)

OTHER PUBLICATIONS

Sa (translation) (Year: 2018).\*
(Continued)

*Primary Examiner* — Matthew T Martin
*Assistant Examiner* — Paul Christian St Wyrough
(74) *Attorney, Agent, or Firm* — Lerner David LLP

(57) ABSTRACT

A battery module includes a cell stack formed by stacking a plurality of battery cells; a bus bar frame assembly; and an outer terminal. The bus bar frame assembly includes a bus bar frame and a plurality of bus bars fixed on the bus bar frame and electrically connected to the battery cells, the bus bar frame being configured to cover first and second opposing longitudinal ends of the cell stack, and the outer terminal is connected to the plurality of bus bars. A pair of electrode leads of each of the battery cells are formed at locations offset downwardly from a center of the cell stack in a height (Continued)

direction, and the outer terminal is disposed in the space formed above the electrode leads due to the offsetting of the electrode leads.

10 Claims, 11 Drawing Sheets

(51) Int. Cl.
| | |
|---|---|
| *H01M 50/105* | (2021.01) |
| *H01M 50/172* | (2021.01) |
| *H01M 50/178* | (2021.01) |
| *H01M 50/211* | (2021.01) |
| *H01M 50/271* | (2021.01) |
| *H01M 50/284* | (2021.01) |
| *H01M 50/289* | (2021.01) |
| *H01M 50/296* | (2021.01) |
| *H01M 50/50* | (2021.01) |
| *H01M 50/531* | (2021.01) |
| *H01M 50/548* | (2021.01) |
| *H01M 50/569* | (2021.01) |
| *H01R 12/77* | (2011.01) |

(52) U.S. Cl.
CPC ....... *H01M 10/486* (2013.01); *H01M 50/105* (2021.01); *H01M 50/172* (2021.01); *H01M 50/178* (2021.01); *H01M 50/211* (2021.01); *H01M 50/271* (2021.01); *H01M 50/284* (2021.01); *H01M 50/296* (2021.01); *H01M 50/50* (2021.01); *H01M 50/531* (2021.01); *H01M 50/548* (2021.01); *H01M 50/569* (2021.01); *H01R 12/778* (2013.01); *H01M 50/289* (2021.01); *H01M 2220/20* (2013.01)

(58) Field of Classification Search
USPC .......................................... 429/162
See application file for complete search history.

(56) References Cited

U.S. PATENT DOCUMENTS

| | | |
|---|---|---|
| 2013/0101883 A1 | 4/2013 | Zhao |
| 2015/0037664 A1 | 2/2015 | Kang et al. |
| 2016/0233465 A1 | 8/2016 | Lee et al. |
| 2018/0006281 A1 | 1/2018 | Eom et al. |
| 2019/0348720 A1 | 11/2019 | Oh et al. |
| 2020/0044224 A1 | 2/2020 | Lee et al. |

FOREIGN PATENT DOCUMENTS

| | | | |
|---|---|---|---|
| CN | 206878083 U | 1/2018 | |
| JP | 2001256959 A | 9/2001 | |
| JP | 2014532958 A | 12/2014 | |
| KR | 20060134549 A | 12/2006 | |
| KR | 20130124622 A | 11/2013 | |
| KR | 20160016503 A | 2/2016 | |
| KR | 20160123804 A | 10/2016 | |
| KR | 101870010 B1 | 6/2018 | |
| KR | 20180099438 A * | 9/2018 | ............... H05K 1/89 |
| KR | 20180099438 A | 9/2018 | |
| KR | 20180133698 A | 12/2018 | |
| WO | 2018124494 A2 | 7/2018 | |
| WO | 2018124751 A1 | 7/2018 | |

OTHER PUBLICATIONS

Search report from International Application No. PCT/KR2019/018140, dated Apr. 1, 2020.
Extended European Search Report including Written Opinion for Application No. 19904109.6 dated Jun. 15, 2021, 9 pages.
Search Report dated May 11, 2022 from Office Action for Chinese Application No. 201980026250.3 dated May 23, 2022. 3 pgs.

* cited by examiner

BATTERY MODULE HAVING STRUCTURE IN WHICH ENERGY DENSITY IS IMPROVED, AND BATTERY PACK AND VEHICLE COMPRISING SAME

CROSS-REFERENCE TO RELATED APPLICATIONS

The present application is a national phase entry under 35 U.S.C. § 371 of International Application No. PCT/KR2019/018140 filed Dec. 19, 2019, which claims priority from Korean Patent Application No. 10-2018-0169967 filed on Dec. 26, 2018, the disclosures of which are incorporated herein by reference.

TECHNICAL FIELD

The present disclosure relates to a battery module having a structure with an improved energy density, and a battery pack and a vehicle including the battery module, and more particularly, to a battery module having a structure with an improved energy density by applying a battery cell in which an electrode lead is drawn at a biased location and disposing components such as an outer terminal and/or a connector by using a space formed above the electrode lead due to the biased location, and a battery pack and a vehicle including the battery module.

BACKGROUND ART

A conventional battery module has a structure in which an electrode lead of a battery cell is drawn out from a central portion of the battery cell in a width direction, and thus the overall height or length of the battery module is inevitably increased in order to mount components such as an outer terminal that constitutes the battery module.

Referring to FIG. 1, a conventional battery cell 1 is shown. The conventional battery cell 1 has a structure in which an electrode lead 3 is drawn out from a center portion of a cell case 2 in a width direction (the Z-axis direction of FIG. 1).

Due to the drawn location of the electrode lead 3, the space D formed above and below the electrode lead 3 (that means upper and lower directions along the Z-axis based on FIG. 1) inevitably becomes a dead space that is insufficient to dispose components. For this reason, in order to arrange components such as an outer terminal, both longitudinal sides of the battery cell 1 (in the Y-axis direction of FIG. 1) or both widthwise sides of the battery cell 1 are inevitably used.

This eventually leads to an increase in the overall height and/or length of the battery module, and thus the ratio of energy capacity of the cell stack to the volume of the battery module, namely the energy density, is lowered.

In the field of secondary batteries, it is very important to improve the energy density. Thus, there is a need for a structural improvement method to improve the energy density without significantly changing the manufacturing process since the structure of the existing battery module is not changed greatly.

DISCLOSURE

Technical Problem

The present disclosure is designed to solve the problems of the related art, and therefore the present disclosure is directed to improving the energy density of a battery module without significantly changing its manufacturing process since the structure of an existing battery module is not changed greatly.

However, the technical problem to be solved by the present disclosure is not limited to the above, and other objects not mentioned herein will be understood from the following description by those skilled in the art.

Technical Solution

In one aspect of the present disclosure, there is provided a battery module, comprising: a cell stack formed by stacking a plurality of battery cells; a bus bar frame assembly including a bus bar frame configured to cover one longitudinal end and the other longitudinal end of the cell stack and a plurality of bus bars fixed on the bus bar frame and electrically connected to the battery cells; and an outer terminal connected to the bus bar, wherein the battery cell includes an electrode assembly, a pair of electrode leads connected to the electrode assembly and extending in opposite directions along a longitudinal direction of the battery cell, and a cell case configured to accommodate the electrode assembly and sealed to expose the electrode lead to the outside, the pair of electrode leads are formed at locations biased downward from a center of the cell stack in a height direction, and the outer terminal is disposed in the space formed above the electrode lead due to biasing of the electrode lead.

The battery module may further comprise a FPCB assembly including a first FPCB extending along a longitudinal direction of the cell stack to cover at least a portion of an upper surface of the cell stack, a second FPCB extending from both longitudinal ends of the first FPCB and electrically connected to the bus bars, and a pair of temperature sensors mounted to both longitudinal ends of the first FPCB.

The FPCB assembly may further include a connector mounted to the second FPCB and positioned in the space formed above the electrode lead due to biasing of the electrode lead.

The first FPCB may have a temperature sensor placing portion formed by cutting a part of the first FPCB.

One of both longitudinal ends of the temperature sensor placing portion may be formed as a fixed end and the other may be formed as a free end, and both widthwise ends of the temperature sensor placing portion may be formed as free ends.

The battery module may further comprise an upper cover configured to cover an upper portion of the cell stack and the first FPCB.

A connection portion of the first FPCB and the second FPCB may be drawn out through a gap between the bus bar frame and the upper cover.

The battery cell may have a ratio of length to width in the range of 3 to 12.

Meanwhile, in another aspect of the present disclosure, there are also provided a battery pack and a vehicle, which comprises the battery module according to an embodiment of the present disclosure.

Advantageous Effects

According to an embodiment of the present disclosure, it is possible to improve the energy density of a battery module without significantly changing its manufacturing process since the structure of an existing battery module is not changed greatly.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but rather interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustration only, not intended to limit the scope of the disclosure, so it should be understood that other equivalents and modifications could be made thereto without departing from the scope of the disclosure.

First, the overall configuration of a battery module according to an embodiment of the present disclosure will be described with reference to FIGS. 2 to 4.

Figure 1:
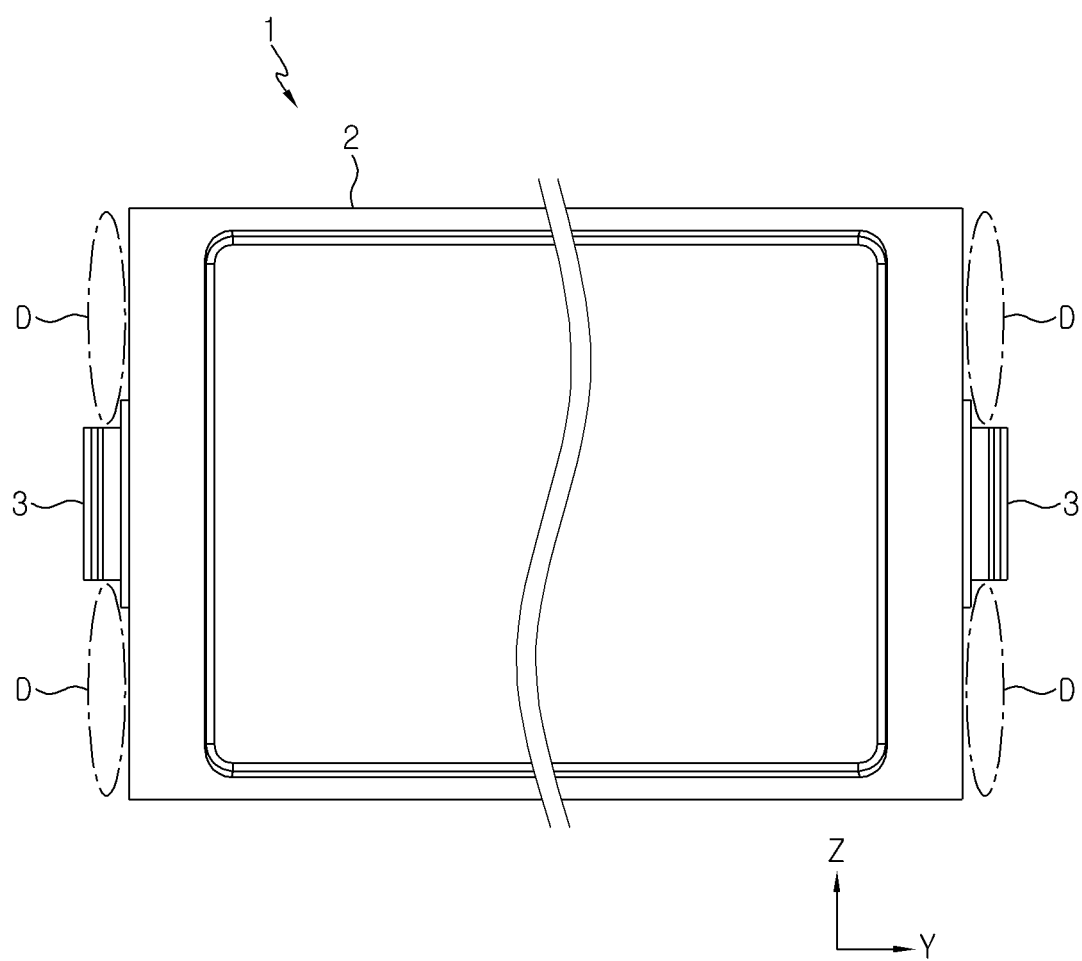
FIG. 1 is a diagram showing a conventional battery cell.
Figure 2:
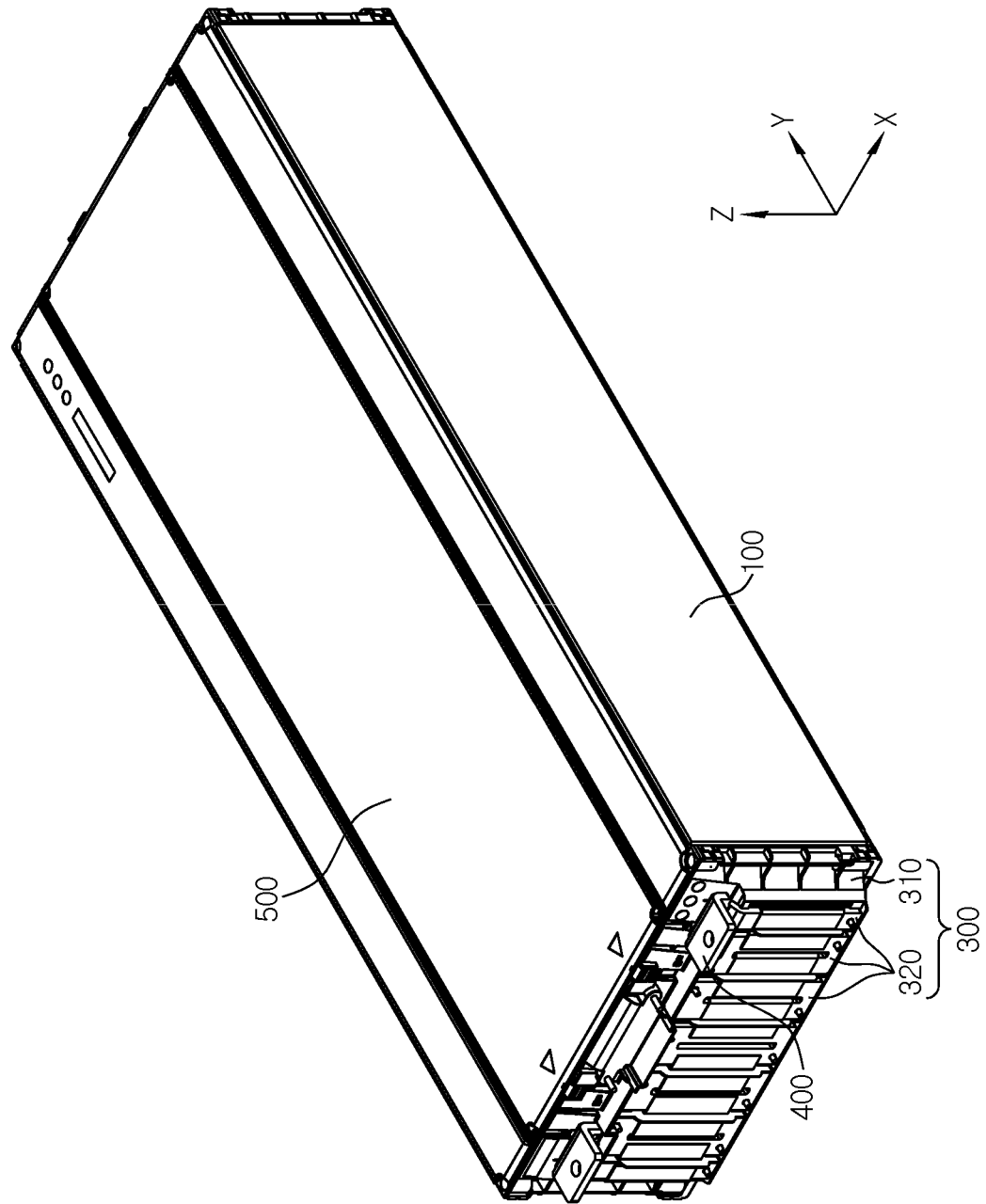
FIG. 2 is a perspective view showing a battery module according to a first embodiment of the present disclosure.

FIG. 2 is a perspective view showing a battery module according to a first embodiment of the present disclosure; FIG. 3 is a perspective view showing a cell stack applied to the battery module according to the first embodiment of the present disclosure; and FIG. 4 is a plan view showing a battery cell applied to the battery module according to the first embodiment of the present disclosure.

Figure 3:
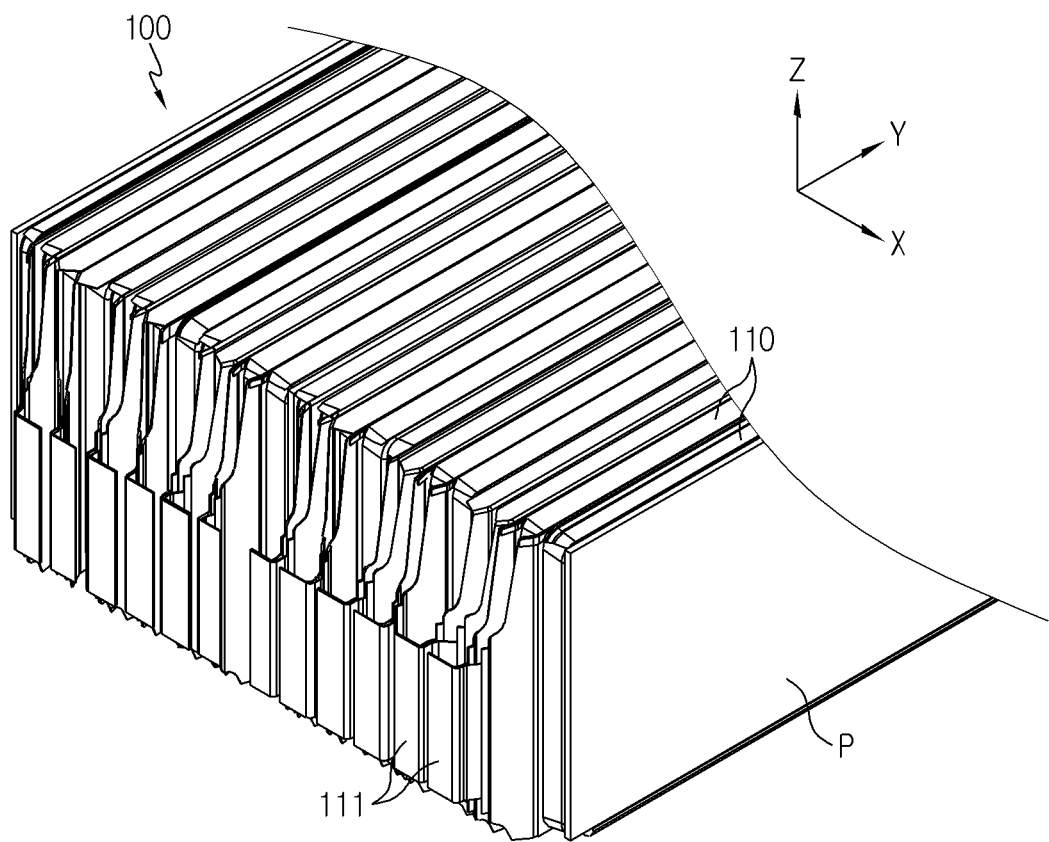
FIG. 3 is a perspective view showing a cell stack applied to the battery module according to the first embodiment of the present disclosure.
Figure 4:
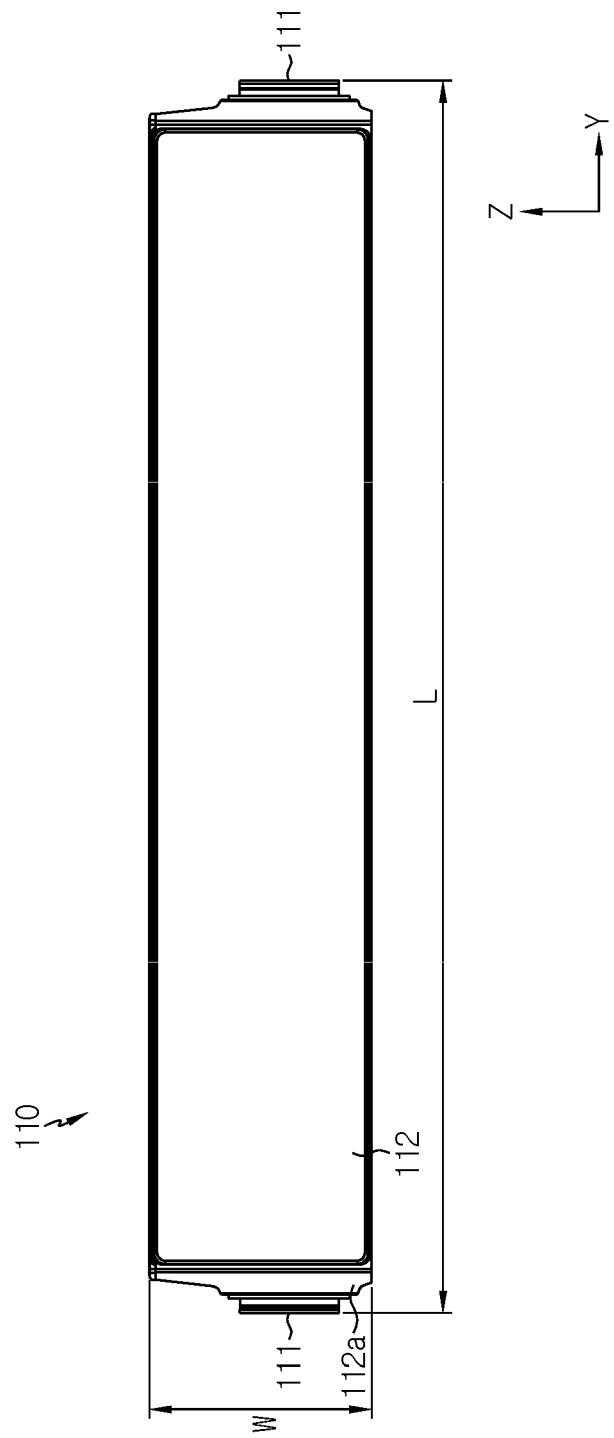
FIG. 4 is a plan view showing a battery cell applied to the battery module according to the first embodiment of the present disclosure.

Referring to FIGS. 2 to 4, a battery module according to an embodiment of the present disclosure may be implemented to include a cell stack 100, a bus bar frame assembly 300, an outer terminal 400 and an upper cover 500.

The cell stack 100 includes a plurality of battery cells 110 stacked to face each other at wide surfaces thereof. The cell stack 100 may include at least one buffer pad P interposed at an outermost battery cell 110 and/or between adjacent battery cells 110.

That is, the cell stack 100 may be inserted into a mono frame (not shown) in a state of being coupled with the bus bar frame assembly 300, the outer terminal 400 and the upper cover 500. At this time, in order to insert the cell stack 100 easily while securing a maximum volume of the cell stack 100, the buffer pad P made of an elastic material such as a sponge may be additionally applied.

A pouch-type battery cell may be applied as the battery cell 110. Referring to FIG. 4, the pouch-type battery cell 110 includes an electrode assembly (not shown), a pair of electrode leads 111 and a cell case 112.

Although not shown in the drawings, the electrode assembly has a form in which separators are interposed between positive electrode plates and negative electrode plates that are repeatedly stacked alternately, and separators are preferably positioned at both outermost sides for insulation, respectively.

The positive electrode plate includes a positive electrode current collector and a positive electrode active material layer coated on one side of the positive electrode current collector, and a positive electrode uncoated region not coated with a positive electrode active material is formed at one side end of the positive electrode plate. The positive electrode uncoated region functions as a positive electrode tab.

The negative electrode plate may include a negative electrode current collector and a negative electrode active material layer coated on one surface or both sides of the negative electrode current collector, and a negative electrode uncoated region not coated with a negative electrode active material is formed at one side end of the negative electrode plate. The negative electrode uncoated region functions as a negative electrode tab.

In addition, the separator is interposed between the positive electrode plate and the negative electrode plate to prevent electrode plates having different polarities from directly contacting each other. The separator may be made of a porous material so that ions may be moved using the electrolyte as a medium between the positive electrode plate and the negative electrode plate.

The pair of electrode leads 111 are connected to the positive electrode tab (not shown) and the negative electrode tab (not shown), respectively, and are drawn out of the cell case 112. The pair of electrode leads 111 are drawn out at one longitudinal side and the other longitudinal side of the battery cell 110, respectively. That is, the battery cell 110 applied to the present disclosure corresponds to a bidirectional draw-out battery cell in which the positive electrode lead and the negative electrode lead are drawn in opposite directions.

In addition, the pair of electrode leads 111 are positioned to be biased to one side from a center of the battery cell 110 in a width direction (the Z-axis direction of FIG. 3). Specifically, the pair of electrode leads 111 are positioned to be biased to one side from the center of the battery cell 110 in the width direction, preferably to be biased downward along the height direction (the Z-axis direction of FIG. 2) of the cell stack 100.

If the pair of electrode leads 111 are positioned to be biased to one side from the center of the battery cell 110 in the width direction as described above, it is possible to provide a space for installation of the outer terminal 400 so that the energy density of the battery module is improved. The increase in energy density due to the structure in which the electrode lead 111 is installed so to be biased will be described in detail later.

The cell case 112 includes two regions, namely an accommodation portion accommodating the electrode assembly and a sealing portion extending in a circumferential direction of the accommodation portion and thermally fused in a state where the electrode lead 111 is drawn out to seal the cell case 112.

Although not shown in the figures, the cell case 112 is sealed by affixing and thermally fusing edge portions of an upper case and a lower case made of a multi-layered pouch film in which a resin layer, a metal layer and a resin layer are stacked in order.

In the sealing portion, a terrace portion 112a corresponding to a region located in the direction in which the electrode lead 111 is drawn out has a tapered shape such that both sides of the terrace portion 112a are cut so that the width thereof is gradually reduced along the drawing direction of the electrode lead 111. As described above, if the width of the terrace portion 112a is gradually reduced toward the outer side of the battery cell 110, the electrode lead 111 may be disposed to be biased to one side, and the energy density of the battery module may be improved.

Meanwhile, the battery cell 110 applied to the present disclosure is a long cell where a ratio of length (L) to width (W) is about 3 or more and 12 or less. In the battery module according to the present disclosure, if the long cell type battery cell 110 is employed, it is possible to improve the capacity of the battery while minimizing the increase in the height of the battery module, which makes it easy to install the battery module at a lower part of a seat or a trunk of a vehicle.

Next, the bus bar frame assembly 300, the outer terminal 400 and the upper cover 500 applied to the present disclosure will be described in detail with reference to FIGS. 5 and 6.

Figure 5:
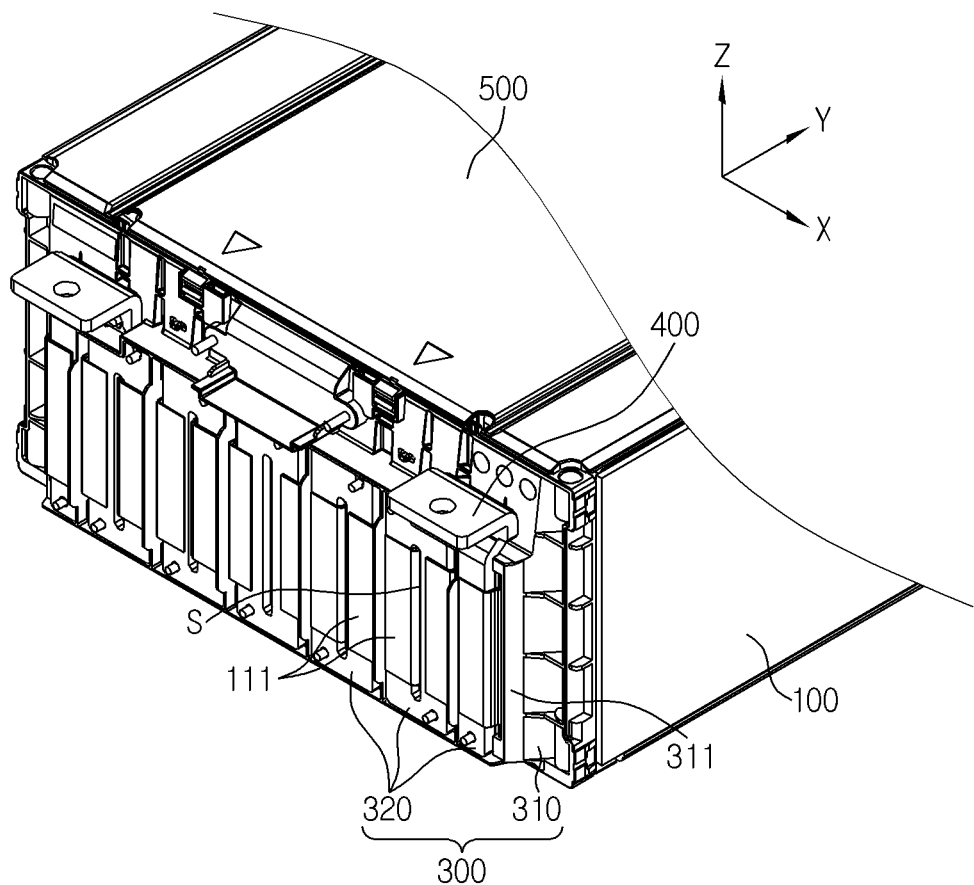
FIG. 5 is a partial enlarged perspective view showing the battery module of FIG. 2.
Figure 6:
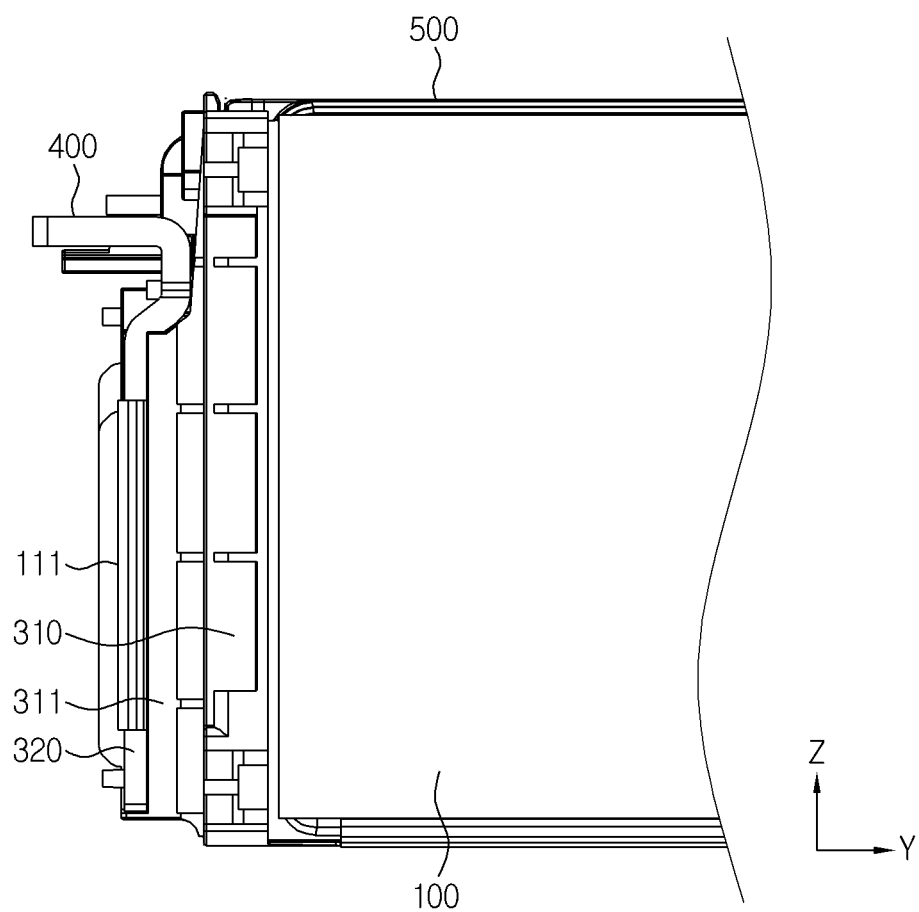
FIG. 6 is a partial side view showing the battery module of FIG. 2.

Referring to FIGS. 5 and 6, the bus bar frame assembly 300 may be implemented to include a bus bar frame 310 configured to cover one longitudinal end and the other longitudinal end of the cell stack 100 and a plurality of bus bars 320 fixed on the bus bar frame 310 and electrically connected to the battery cells 110.

The bus bar frame 310, for example, may be made of an insulating material such as resin, and includes a bus bar placing portion 311 formed to protrude at a position corresponding to electrode leads 111 of the battery cell 110. The bus bar placing portion 311 is formed at a position biased downward from the center of the cell stack 100 in the height direction (the Z-axis direction of FIG. 5), like the electrode lead 111. The biasing of the bus bar placing portion 311 is to secure a space for installing components, similar to the biasing of the electrode lead 111.

The bus bar placing portion 311 has a plurality of lead slits S formed at positions corresponding to the electrode leads 111. Through the lead slits S, the electrode leads 111 are drawn out of the bus bar frame assembly 300, and the drawn electrode leads 111 are bent and fixed by welding or the like on the bus bar 320.

The outer terminal 400 is provided in a pair, and the outer terminals 400 are respectively connected to the bus bars 320 located at outsides of the both sides of the cell stack 100 in the width direction (the X-axis direction of FIG. 5).

The outer terminal 400 is located in the space formed above the electrode lead 111 and the bus bar placing portion 311 due to the biasing of the electrode lead 111 (the space formed in an upper direction along the Z-axis based on FIG. 5). The location where the outer terminal 400 is formed may minimize the volume of the battery module increased by installing the outer terminal 400 since it utilizes the space formed by the biased installation of the electrode lead 111.

The upper cover 500 corresponds to a component that covers an upper surface of the cell stack 100 (a surface parallel to the X-Y plane of FIG. 5). The upper cover 500 is hinged to the pair of bus bar frames 310, respectively. Thus, the pair of bus bar frames 310 may pivot relative to the upper cover 500 based on the hinged portion.

As described above, the battery module according to an embodiment of the present disclosure has a structure in which the outer terminal 400 may be installed using the space formed above the electrode lead 111 and the bus bar placing portion 311 due to biasing of the electrode lead 111 of the battery cell 110. Thus, the battery module according to an embodiment of the present disclosure may minimize the increase in volume of the battery module caused by the installation of components, thereby improving the energy density.

Next, the overall configuration of the battery module according to another embodiment of the present disclosure will be described with reference to FIGS. 7 to 10.

Figure 7:
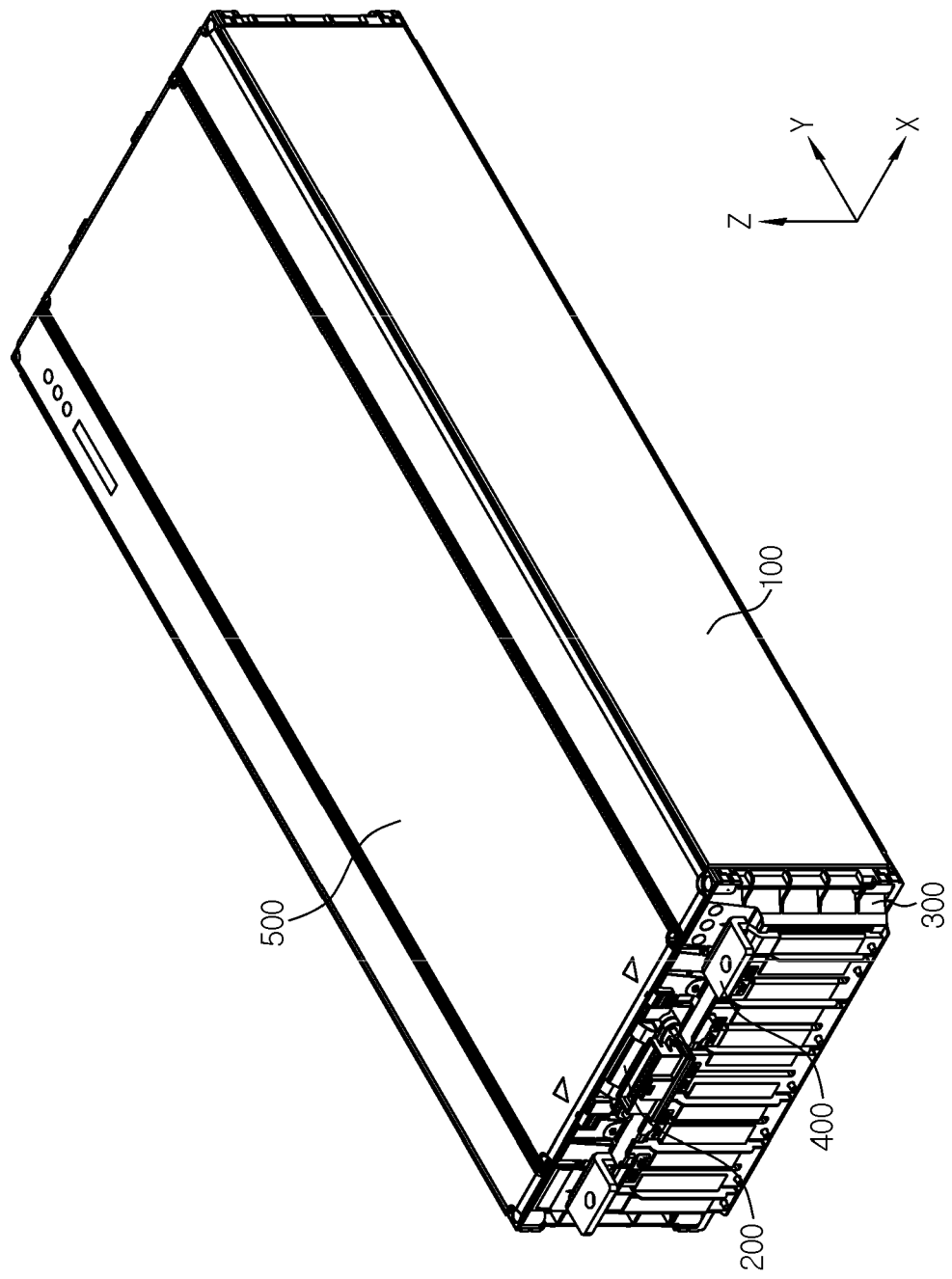
FIG. 7 is a perspective view showing a battery module according to a second embodiment of the present disclosure.
Figure 8:
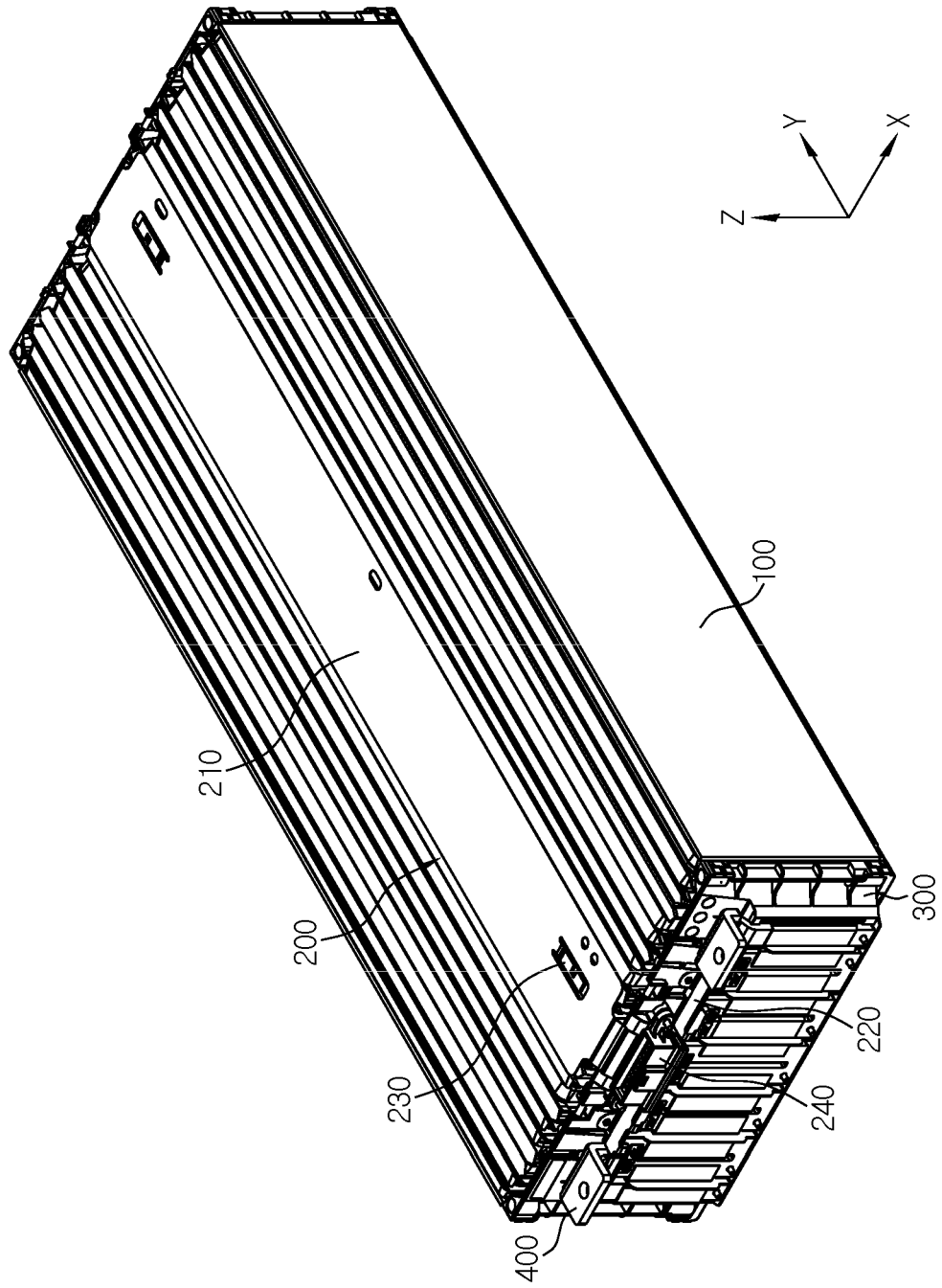
FIG. 8 is a perspective view showing the battery module according to the second embodiment of the present disclosure, from which an upper cover is removed.
Figure 9:
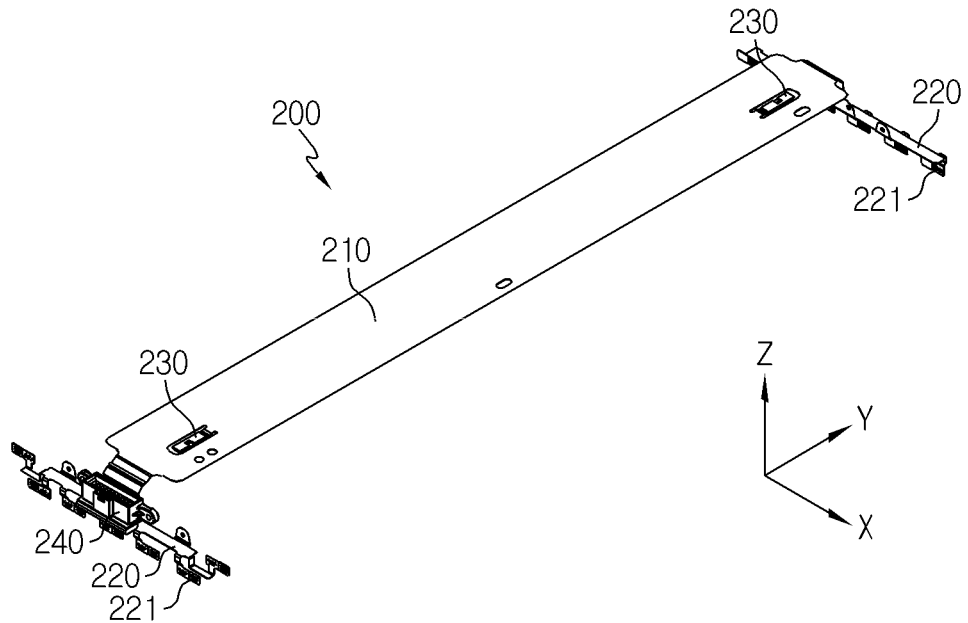
FIG. 9 is a perspective view showing a FPCB assembly applied to the battery module according to the second embodiment of the present disclosure.
Figure 10:
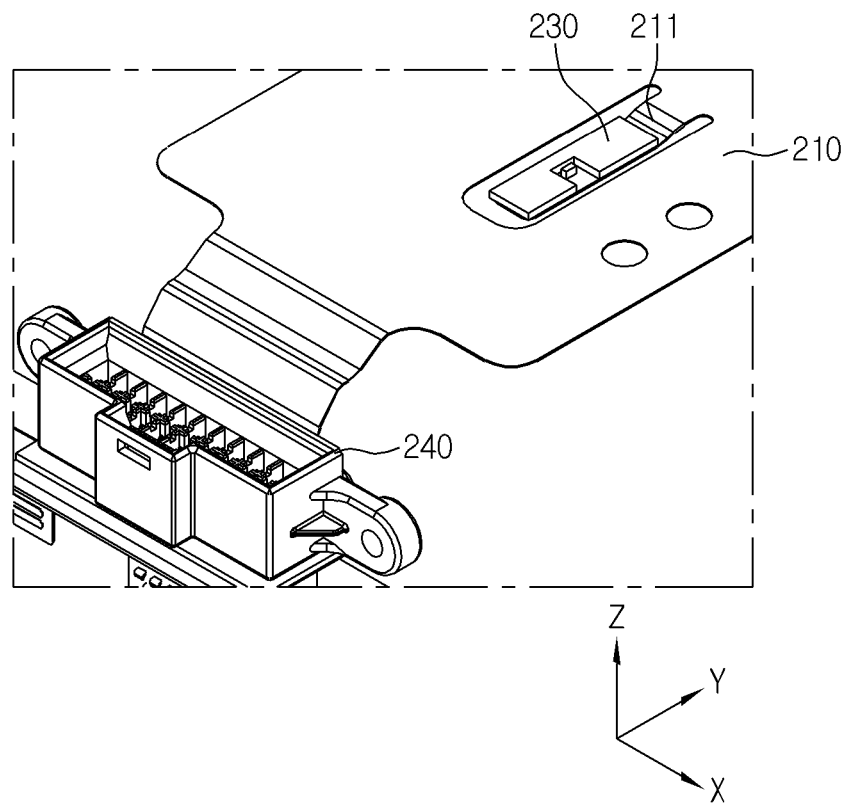
FIG. 10 is a partial enlarged perspective view showing the FPCB assembly of FIG. 9.

FIG. 7 is a perspective view showing a battery module according to a second embodiment of the present disclosure, and FIG. 8 is a perspective view showing the battery module according to the second embodiment of the present disclosure, from which an upper cover is removed. Also, FIG. 9 is a perspective view showing a FPCB assembly applied to the battery module according to the second embodiment of the present disclosure, and FIG. 10 is a partial enlarged perspective view showing the FPCB assembly of FIG. 9.

The battery module according to the second embodiment of the present disclosure is different from the battery module according to the first embodiment of the present disclosure described above in that a FPCB assembly 200 is additionally provided, and other components are substantially identical. Thus, in describing the battery module according to the second embodiment of the present disclosure, the FPCB assembly 200, which is different from the former embodiment, will be mainly described, and other components will not be described in detail.

Referring to FIGS. 7 to 10, the battery module according to the second embodiment of the present disclosure may be implemented to include a cell stack 100, a FPCB assembly 200, a bus bar frame assembly 300, an outer terminal 400 and an upper cover 500.

The FPCB assembly 200 may be implemented to include a first FPCB 210, a second FPCB 220, a temperature sensor 230 and a connector 240. In the present disclosure, the first FPCB 210 and the second FPCB 220 are described as components distinguished from each other, but the first FPCB 210 and the second FPCB 220 may be a single integrated flexible printed circuit board (FPCB). That is, the first FPCB 210 and the second FPCB 220 are just elements that are distinguished according to positions where they are disposed.

The first FPCB 210 extends along the longitudinal direction of the cell stack 100 (the Y-axis direction of FIGS. 4 and 5) to cover at least a portion of the upper surface of the cell stack 100. The both longitudinal ends of the first FPCB 210 are provided with a temperature sensor placing portion 211 formed by cutting a portion of the first FPCB 210.

The temperature sensor 230 is mounted to the upper surface of the temperature sensor placing portion 211, whereby the temperature sensor 230 is installed at positions corresponding to both longitudinal ends of the cell stack 100. In addition, the temperature sensor placing portion 211 is located at the center of the cell stack 100 in the width direction (the X-axis of FIG. 8). Accordingly, the temperature sensor 230 is installed at a position corresponding to the center of the cell stack 100 in the width direction.

The position where the temperature sensor placing portion 211 is formed is selected to sense a temperature of a portion with the highest temperature in the cell stack 100. The FPCB assembly 200 may be connected to a control device that may control charging and discharging of the battery module, such as a battery management system (BMS). If the temperature of the battery module rises above a reference value, in order to ensure safety in use of the battery module, it is preferable to measure the temperature at a location with the highest temperature to control charging and discharging.

Thus, in the longitudinal direction of the cell stack 100, both longitudinal ends closest to the electrode lead 111 become optimal positions, and in the width direction of the cell stack 100, the center where heat dissipation is most difficult becomes an optimal position.

As shown in FIG. 10, the temperature sensor placing portion 211 is formed by cutting a part of the first FPCB 210, and one of both longitudinal ends of the temperature sensor placing portion 211 is formed as a fixed end and the other is formed as a free end. In addition, both widthwise ends of the temperature sensor placing portion 211 are formed as free ends by cutting.

By doing so, the temperature sensor placing portion 211 may move up and down freely despite the characteristics of the FPCB having a certain degree of stiffness. Accordingly, the temperature sensor 230 mounted to the temperature sensor placing portion 211 is indirectly adhered to the cell stack 100 through the temperature sensor placing portion 211, thereby accurately measuring the temperature of the cell stack 100.

Next, the second FPCB 220 and the connector 240 applied to the present disclosure will be described in detail with reference to FIGS. 11 and 12 along with FIG. 9.

Figure 11:
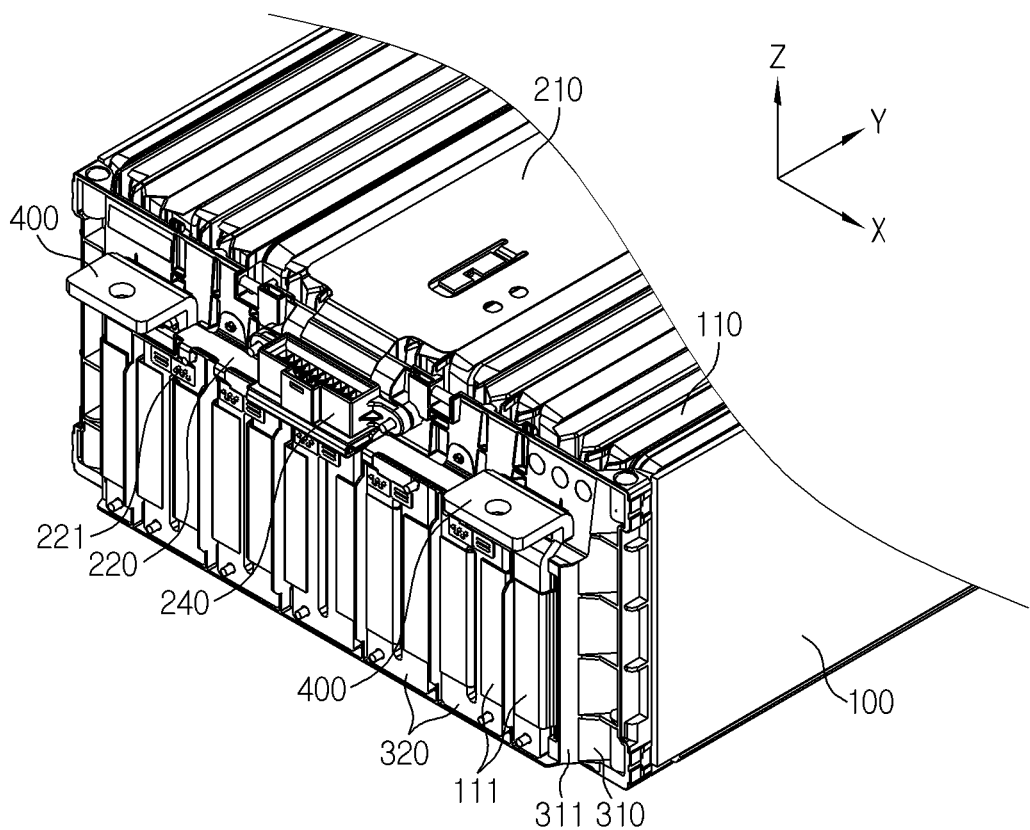
FIG. 11 is a partial enlarged perspective view showing the battery module of FIG. 7.
Figure 12:
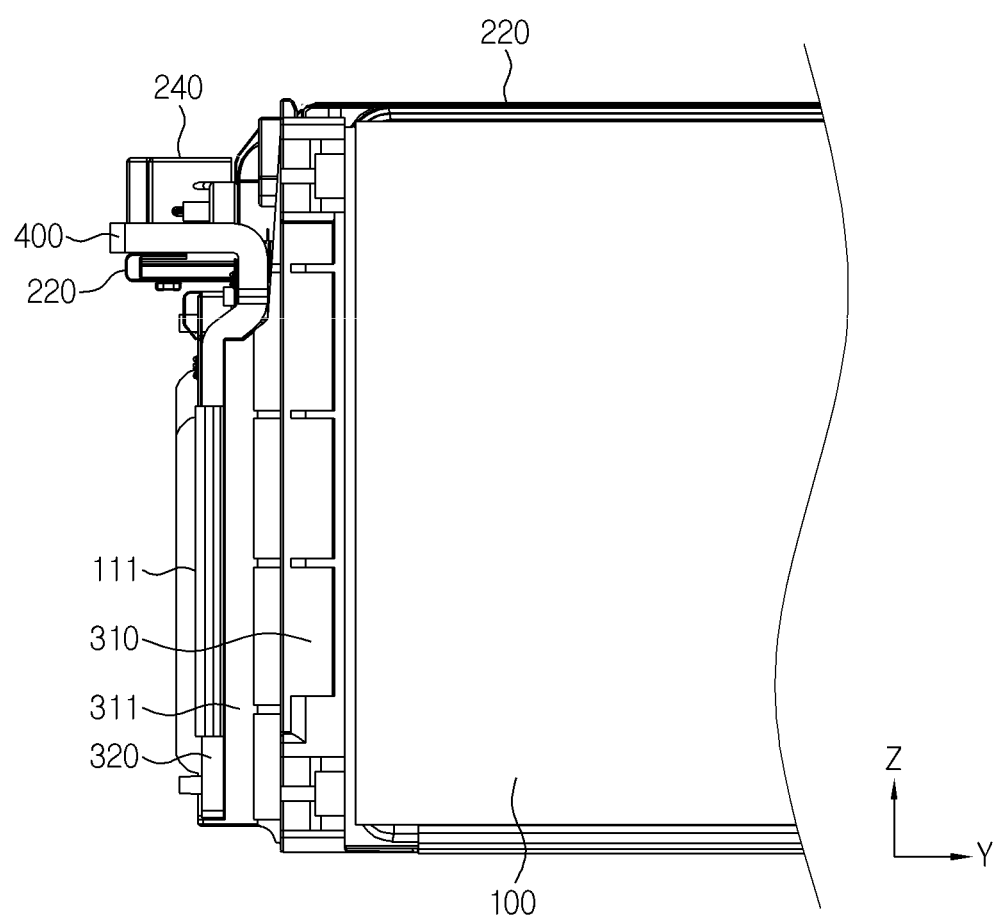
FIG. 12 is a partial side view showing the battery module of FIG. 11.

FIG. 11 is a partial enlarged perspective view showing the battery module of FIG. 7, and FIG. 12 is a partial side view showing the battery module of FIG. 11.

Referring to FIGS. 11 and 12 along with FIG. 9, the second FPCB 220 is provided in a pair, and the second FPCBs 220 extend from both longitudinal ends of the first FPCB 210 and are electrically connected to a bus bar 320, respectively. That is, the second FPCB 220 has a plurality of connection terminals 221 formed at several branched ends, and the plurality of connection terminals 221 are connected to a plurality of the bus bars 320.

Meanwhile, the connector 240 is mounted on the second FPCB 220, and the connector 240 is electrically connected to the connection terminal 221 through the FPCB. A control device (not shown) such as BMS is connected to the connector 240, and the control device receives information about a voltage of the battery cell 110 measured through the bus bar 320 and the connection terminal 221, information about a temperature of the cell stack 100 measured through the temperature sensor 230, or the like, and controls charging and discharging of the battery module with reference to the information.

Meanwhile, as shown in FIGS. 11 and 12, the connector 240 mounted on the second FPCB 220 faces a front surface (a surface parallel to the X-Y plane of FIG. 11) of the cell stack 100 but is installed in a space formed above the electrode lead 111 due to the biasing of the electrode lead 111. That is, the connector 240 is installed to face an upper portion of the front surface of the cell stack 100.

That is, the connector 240 is installed in the space provided due to the structure in which the electrode lead 111 is installed to be biased, which minimizes the overall volume increase of the battery module caused by the installation of the connector 240, thereby improving energy density.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

What is claimed is:
1. A battery module, comprising:
a cell stack defined by a plurality of battery cells stacked on one another in a stacking dimension, each of the battery cells including an electrode assembly, a pair of electrode leads connected to the electrode assembly and extending in opposite directions along a longitudinal dimension of the cell stack, and a cell case accommodating the electrode assembly therein, the cell case being sealed such that the electrode leads are exposed out through the cell case, wherein each of the electrode leads are positioned at locations offset towards a first direction from a central longitudinal axis of the cell stack in a width dimension of the cell stack, the central longitudinal axis extending along the longitudinal dimension of the cell stack, and the width dimension defined orthogonally to both the longitudinal dimension and the stacking dimension;
a bus bar frame assembly including a bus bar frame and a plurality of bus bars fixed on the bus bar frame and electrically connected to the battery cells, the bus bar frame covering a first end and a second end of the cell stack, the first and second ends opposing one another along the longitudinal dimension of the cell stack;
an outer terminal connected to the plurality of bus bars and positioned at the first end of the cell stack;
a second outer terminal connected to the plurality of bus bars and positioned at the first end of the cell stack, the second outer terminal being spaced apart from the outer terminal in the stacking dimension, wherein the outer terminal and the second outer terminal are disposed in a space defined in a second direction from the electrode leads, the second direction being opposite the first direction along the width dimension; and
a flexible printed circuit board (FPCB) assembly, including:
a first FPCB extending along the longitudinal dimension of the cell stack and covering at least a portion of a first surface of the cell stack in the width dimension;
a second FPCB electrically connected to the plurality of bus bars and extending from opposing first and second ends of the first FPCB along the longitudinal dimension;
at least one temperature sensor coupled to the first FPCB; and
a connector mounted to the second FPCB and positioned in the space defined in the second direction from the electrode leads, the connector being positioned at the first end of the cell stack between the outer terminal and the second outer terminal along the stacking dimension, wherein the outer terminal defines a linear extension extending along the longitudinal dimension from a connected end to a free end of the linear extension, the connected end of the linear extension being electrically connected to the plurality of bus bars via an intermediate portion, the intermediate portion extending away from the plurality of bus bars in the second direction and towards the cell stack along the longitudinal dimension, such that the connected end of the outer terminal is disposed closer to the cell stack along the longitudinal dimension than the plurality of bus bars, and wherein the first FPCB is disposed on the cell stack without other components interposed between the first FPCB and the cell stack.

2. The battery module according to claim 1, wherein the at least one temperature sensor comprises a pair of temperature sensors mounted to both first and second ends of the first FPCB.

3. The battery module according to claim 2, wherein one of the pair of temperature sensors is mounted to a temperature sensor placing portion defined by a cut part of the first FPCB.

4. The battery module according to claim 3, wherein a first end of the temperature sensor placing portion in the longitudinal dimension is fixed to an adjacent portion of the first FPCB, and wherein a first side and a second side of the temperature sensor placing portion in the stacking dimension and a second end of the temperature sensor placing portion, opposite the first end in the longitudinal dimension, are separated from other portions of the first FPCB by the cut part such that the first side, second side, and second end of the temperature sensor can move transverse to the other portions of the first FPCB in the width dimension.

5. The battery module according to claim 2, further comprising:

an upper cover configured to cover the first surface of the cell stack and the first FPCB.

6. The battery module according to claim 5, wherein a connection portion of the first FPCB and the second FPCB extends out through a gap between the bus bar frame and the upper cover.

7. The battery module according to claim 1, wherein the battery cell has a ratio of length to width in the range of 3 to 12, the length defined along the longitudinal dimension and the width defined along the width dimension.

8. A battery pack, comprising the battery module according to claim 1.

9. A vehicle, comprising the battery module according to claim 1.

10. The battery module according to claim 1, wherein the intermediate portion extends away from the plurality of bus bars along a line extending obliquely to both the second direction and the longitudinal dimension.

* * * * *